United States Patent [19]
Eklund et al.

[11] Patent Number: 6,091,014
[45] Date of Patent: Jul. 18, 2000

[54] THERMOELECTRIC MATERIALS BASED ON INTERCALATED LAYERED METALLIC SYSTEMS

[75] Inventors: Peter C. Eklund, Nicholasville; Leonid Grigorian, Lexington; Keith A. Williams, Lexington; Gamini U. Sumanasekera, Lexington, all of Ky.

[73] Assignee: University of Kentucky Research Foundation, Lexington, Ky.

[21] Appl. No.: 09/270,372

[22] Filed: Mar. 16, 1999

[51] Int. Cl.$^7$ .................................... H01L 35/12
[52] U.S. Cl. ........................ 136/236.1; 136/201
[58] Field of Search ................ 136/201, 236.1, 136/238, 239, 240; 252/62.3 T

[56] References Cited

U.S. PATENT DOCUMENTS

| | | |
|---|---|---|
| 3,310,493 | 3/1967 | Rupprecht . |
| 3,330,703 | 7/1967 | Podolsky . |
| 3,444,006 | 5/1969 | Duncan et al. . |
| 3,900,603 | 8/1975 | Rittmayer et al. . |
| 4,477,374 | 10/1984 | Watanabe et al. . |
| 4,489,742 | 12/1984 | Moore et al. . |
| 4,929,282 | 5/1990 | Brun et al. . |
| 5,108,515 | 4/1992 | Ohta et al. . |
| 5,246,504 | 9/1993 | Ohta et al. . |
| 5,356,485 | 10/1994 | Kreider . |
| 5,415,699 | 5/1995 | Harman . |
| 5,487,952 | 1/1996 | Yoo et al. . |
| 5,712,448 | 1/1998 | Vandersande et al. . |

OTHER PUBLICATIONS

C.K. Subramaniam et al., "Thermoelectric power and the hole concentration in iodine–intercalated Bi2 Sr2 CaCu2Ox crystals," Physica C, Elsevier Science, p. 140–143, (1995).

Shiro Kambe and Maki Kawai, "Effect of S, Se and Te Addition on the Superconductive Properties of Ba2YCu3O7–y," Japanese Journal of Applied Physics, vol. 27 (No. 12), (Dec. 1988).

C. R. Varoy et al., "Thermopower of Bi2–xPbxSr2CaCu2O8+δ," Physical Review B, vol. 46 (No. 1), p. 463–467, (Jul. 1, 1992).

L. S. Grigoryan and A. R. Arutyunyan, "Anomalous diamagnetism at 300 K in benzene–intercalated ceramic with the composition Bi–Pb–Sr–Ca–Cu–O," Sov. Phys. Dokl., American Insitute of Physics, vol. 35 (No. 7), p. 665–666, (Jul. 1990).

S. D. Obertelli et al., "Systematics in the thermoelectric power of high–Tc oxides," Physical Review B, vol. 46 (No. 22), (Dec. 1, 1992).

*Primary Examiner*—Kathryn Gorgos
*Assistant Examiner*—Thomas H Parsons
*Attorney, Agent, or Firm*—King and Schickli, PLLC

[57] ABSTRACT

A novel thermoelectric material in the form of a unit cell including a first reagent intercalated as a semiconducting layer into a metallic layered host and a method for producing the thermoelectric material are disclosed. The unit cell is characterized by a Seebeck coefficient S of 80–140 $\mu V/K°$ and an electrical conductivity $\sigma$ of $10^3$–$10^4 (\Omega cm)^{-1}$, as well as a figure of merit Z of about $2 \times 10^{-3} K^{-1}$ at 100° K.

12 Claims, 5 Drawing Sheets

THERMOELECTRIC MATERIALS BASED ON INTERCALATED LAYERED METALLIC SYSTEMS

TECHNICAL FIELD

The present invention relates generally to the field of thermoelectric materials and, more particularly to novel and highly efficient thermoelectric materials and processes for the production thereof.

BACKGROUND OF THE INVENTION

Thermoelectric materials have enormous potential in commercial, space and defense applications. Such applications include but are not limited to advanced household refrigeration systems, cooling units for cellular base stations, system controls for increasing the fuel efficiency of trucks and cars, computer chips, infrared detectors, recreational coolers, power generation systems aboard spacecraft, as well as air conditioning and power systems in submarines. The primary advantage characteristic of thermoelectric materials is that they are all solid state. They do not require refrigerants or lubricants and they have no moving parts so that they produce no vibrations, no emissions and no noise. As a result, they provide extremely desirable operating characteristics and are also extremely reliable in operation.

The majority of the thermoelectric materials currently in use were discovered and investigated from about 1955–1965. Among these are several Bi—Te—Se, Pb—Te, Bi—Sb alloys. More recent developments in thermoelectric materials include those disclosed in U.S. Pat. 5,415,699 to Harman, U.S. Pat. Nos. 5,108,515 and 5,246,504 to Ohta et al. and U.S. Pat. No. 4,929,282 to Brun et al.

Unfortunately, the efficiency of presently known thermoelectric materials and systems is not very high and, therefore, the principal uses of thermoelectric devices are in applications where reliability is more important than cost (eg. deep space exploration applications). While there are a limited number of thermoelectric materials available that have commercial applications at high temperatures (i.e. above 300° K), very few thermoelectric materials known to those skilled in the art provide the necessary function for low temperature applications such as the construction of refrigerators for cooling a high-temperature superconductor from room temperature to its critical temperature $T_C$ (approximately 100° K).

The overall performance of thermoelectric materials is determined by the figure of merit Z. This quantity is defined by the electrical ($\sigma$) and thermal ($\kappa$) conductivities as well as the thermoelectric power (or Seebeck coefficient) S of the material through the following relations:

$$Z = \frac{\sigma S^2}{\kappa} \quad [1]$$

$$\kappa = \kappa_{el} + \kappa_{ph} \quad [2]$$

$$\sigma T = L\kappa_{el}, \quad [3]$$

where T is temperature and L is a constant. According to the Wiedemann-Franz law (eq. [3]), $\sigma$ is proportional to the electronic component of the thermal conductivity, $\kappa_{el}$, while the lattice contribution, $\kappa_{ph}$, is determined by the type of crystal lattice and the chemical position.

Equations [1–3] indicate that there are no straightforward ways to increase Z. Indeed, in metals, high $\sigma$ is usually accompanied by low S and high $\kappa$. On the other hand, semiconducting materials exhibit high values of S and low $\sigma$. Consequently, the search for thermoelectric materials has in the past to a large extent been conducted within the domain of narrow-band semiconductors: that is those which represent a compromise between the properties of metals and semiconductors and have reasonably high values for both S and $\sigma$. Prior to the present invention, good thermoelectric materials exhibit Z of approximately 0.001 to 0.006 $K^{-1}$ (eg., Z=approximately 0.003 $K^{-1}$ at 300° K for $Bi_2Te_3$) and there are no good thermoelectric materials available that exhibit high Z values at temperatures below 200° K.

SUMMARY OF THE INVENTION

Accordingly, it is a primary object of the present invention to provide novel thermoelectric materials overcoming the shortcomings and limitations of the prior art.

Yet another object of the present invention is to provide new and improved thermoelectric materials characterized by increased Seebeck coefficient values in conjunction with relatively high electrical conductivity values.

Still another object of the present invention is to provide improved thermoelectric materials of sufficient power and efficiency for commercial applications at lower temperatures of below approximately 200° K.

A further object of the present invention is to provide a method for producing thermoelectric materials of the type described in a relatively inexpensive and reliable manner.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purpose of the present invention as described herein, a novel thermoelectric material is provided. That thermoelectric material comprises a unit cell including a semiconducting layer formed from a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof intercalated into a metallic layered host selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

More preferably, the metallic layered host utilized in the thermoelectric material is selected from the group $Bi_2Sr_2Ca_{n-1}Cu_nO_{4+2n}$ or $Tl_2Ba_2Ca_{n-1}Cu_nO_{4+2n}$ where n=1, 2, 3 or 4, $Nd_{2-y}Ce_yCuO_4$ and $La_{2-y}Sr_yCuO_4$ where y=0, 1 or 2 and $Pb_2Sr_2Y_{1-y}Ca_yCu_3O_8$, $HgBa_2Y_{1-y}Ca_yCu_nO_{2n+2}$ where y=0 or 1 and any mixtures thereof.

In the three most preferred embodiments: (1) the semiconducting layer is formed from $FeC_{32}N_{16}H_8$ and the metallic layered host is $Bi_2Sr_2CaCu_2O_8$; the semiconducting layer is formed from Se and the metallic layered host is $Bi_2Sr_2Ca_2Cu_3O_{10}$; and (3) the semiconducting layer is formed from Bi—Se and the metallic layered host is $Bi_2Sr_2Ca_2Cu_3O_{10}$.

Advantageously, the thermoelectric material of the present invention is in the form of a unit cell including semiconducting and metallic layers characterized by a Seebeck coefficient of between substantially 80–140 $\mu V/K°$ and an electrical conductivity of between substantially $10^3$–$10^4 (\Omega\text{ cm})^{-1}$ and are further characterized by a figure of merit Z of about $2\times10^{-3}$ $K^{-1}$ at 100° K. Advantageously, such materials have sufficient efficiency and power to provide a cooling range well below approximately 200° K, thus substantially increasing the potential commercial applications for thermoelectric material cooling elements.

In accordance with still another aspect of the present invention, a method is provided for producing a thermoelectric material of the nature described. This method may be broadly described as incorporating the step of intercalating a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a metallic layered host selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

The intercalating step may be more specifically described as including the sealing of the first reagent and the metallic layered host into an evacuated vessel and the heating of the vessel to promote intercalation of the first reagent (i.e. semiconducting layer forming reagent) into the metallic layered host. That sealing step may be further defined to include the positioning of the first reagent and the metallic layered host at opposite ends of the vessel.

Additionally, the intercalating step may also be described as including the step of annealing to evaporate away any possible surface deposit of non-intercalated first reagent.

Still further, the method may be described as including intercalating a second reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a thermoelectric material consisting of a semiconducting layer formed from said first reagent intercalated into said metallic layered host.

Still other objects of the present invention will become apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawings incorporated in and forming a part of the specification, illustrate several aspects of the present invention and together with the description serve to explain the principles of the invention. In the drawings.

Reference will now be made in detail to the present preferred embodiment of the invention, an example of which is illustrated in the accompanying drawings.

DETAILED DESCRIPTION OF THE INVENTION

The thermoelectric materials of the present invention are highly efficient and advantageously provide both relatively high Seebeck coefficient values and electrical conductivity values in ranges heretofore unavailable in combination. Thus, the thermoelectric materials of the present invention are particularly adapted for a multitude of uses including applications at lower temperatures even below approximately 200° K.

The thermoelectric materials of the present invention take the form of a unit cell including a semiconducting layer formed from a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof.

The first reagent is intercalated into a metallic layered host. The metallic layered host is selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

In the most preferred embodiments the metallic layered host is selected from the group consisting of $Bi_2Sr_2Ca_{n-1}Cu_nO_{4+2n}$ or $Tl_2Ba_2Ca_nO_{4+2n}$ where n=1, 2, 3 or 4, $Nd_{2-y}Ce_yCuO_4$ and $La_{2-y}Sr_y$ $CuO_4$ where y=0, 1 or 2 and $Pb_2Sr_2Y_{1-y}Ca_yCu_3O_8$, $HgBa_2Y_{1-y}Ca_yCu_nO_{2n+2}$ where y=0 or 1 and any mixtures thereof.

Still more preferably the thermoelectric material comprises a unit cell including a semiconducting layer consisting of $FeC_{32}N_{16}H_8$ and a metallic layered host of $Bi_2Sr_2CaCu_2O_8$ or a semiconducting layer of Se and metallic layered host of $Bi_2Sr_2Ca_2Cu_3O_{10}$ or a semiconducting layer of Bi—Se and a metallic layered host of $Bi_2Sr_2Ca_2Cu_3O_{10}$.

Advantageously, the thermoelectric materials of the present invention are characterized by a Seebeck coefficient S of between about 80–140 $\mu V/K°$ and an electrical conductivity σ of between about $10^3–10^4$ $(\Omega cm)^{-1}$. Accordingly, the material comprising this unit cell may be characterized by a figure of merit Z of about $2\times10^{-1}$ at $K^{-1}$ at 100° K.

The thermoelectric materials of the present invention are based on building a crystal structure combining metallic and semiconducting layers within one unit cell. As a result of this approach, high values of S and σ are derived from these semiconducting and metallic layers, respectively. This leads to high Z values for the composite material, which is actually a composite on the atomic scale.

Figure 1:
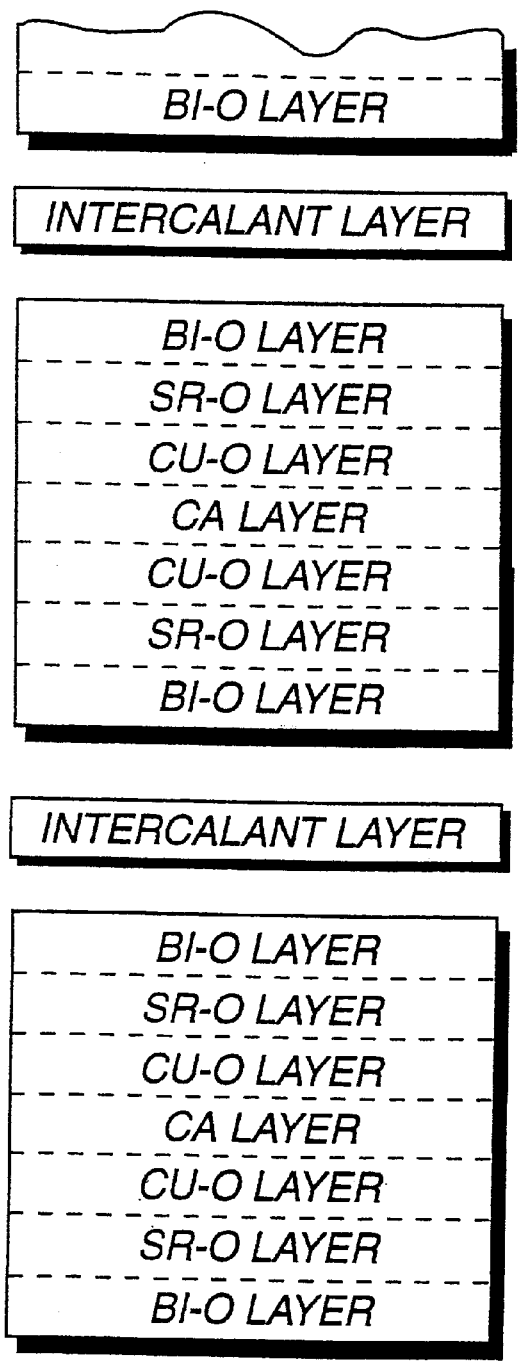
FIG. 1 is a schematical representation of the molecular arrangement of a metallic layered host utilized in the thermoelectric materials of the present invention.
Figure 2:
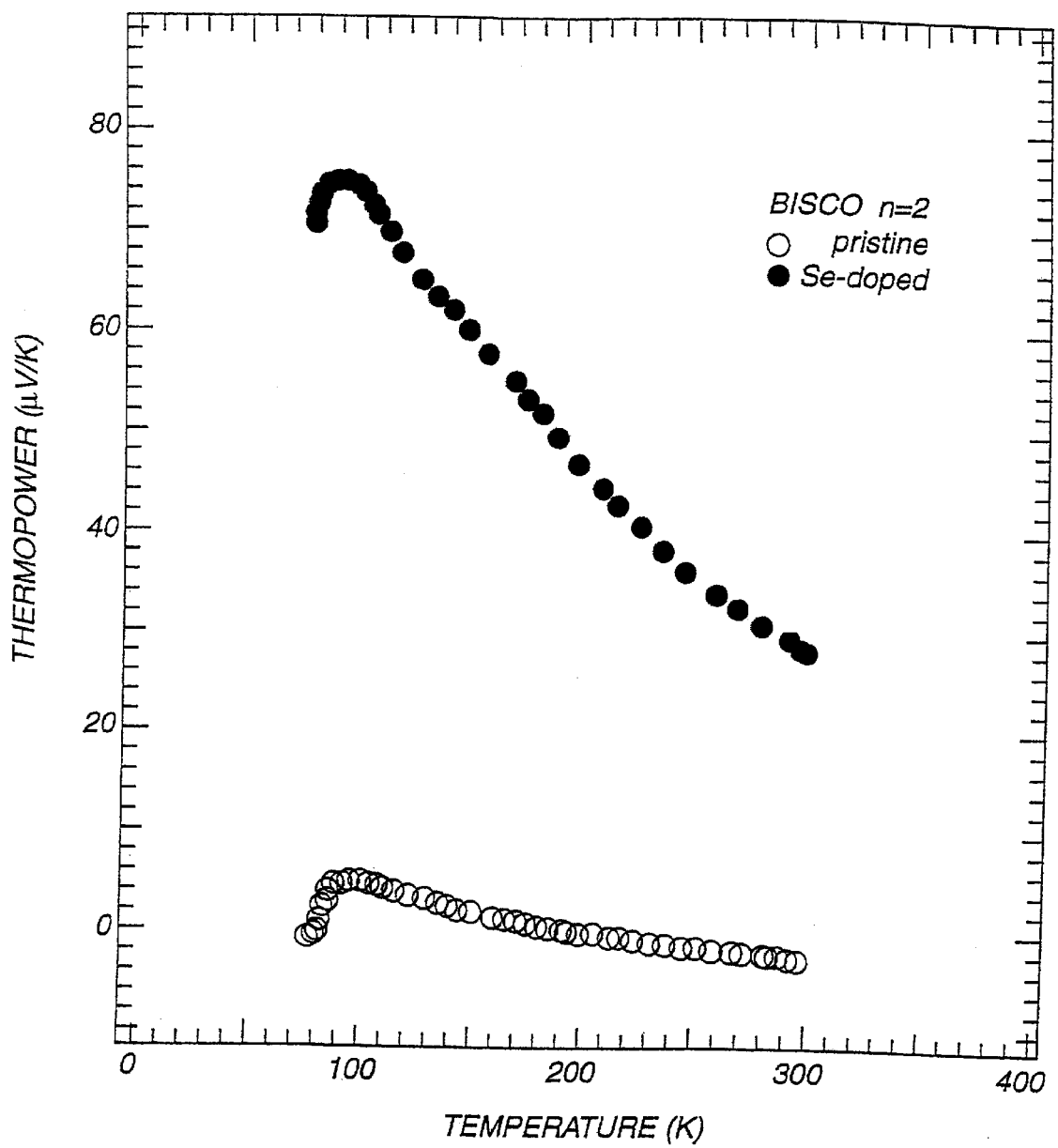
FIG. 2 is a plot demonstrating the relatively increased Seebeck coefficient values characteristic of the thermoelectric materials of the present invention.

The type of crystal structure of the present invention is achieved by intercalating a semiconducting layer forming a first reagent into the layered metallic host. In one particular example, elemental Se has been intercalated into a BISCO ($Bi_2Sr_2Ca_{n-1}Cu_nO_x$ wherein n=1, 2 or 3 and x=6–10) layered metallic host by exposing the BISCO n=2 pellet to Se vapor in an evacuated cell. The crystal structure of the BISCO materials is comprised of unit cell blocks (including 3, 5 or 7 layers for n=1, 2 or 3 respectively) terminated with Bi—O layers and features a gap of ~0.32 nm between the double Bi—O layers. It is this gap which accommodates the intercalant (see FIG. 1). Our observations show that the intercalation with Se results in a dramatic (more than 10-fold) increase in S values (see FIG. 2), while the high metallic conductivity characteristic for the pristine BISCO sample is retained (see FIG. 3). In fact, even the superconducting transition temperature $T_c$ is little affected by the reaction, indicating that the coherence of the Cu—O layers had not been compromised.

We attribute the observed thermopower enhancement to the insertion of a Se layer between the weakly bound double Bi—O layers, leading to formation of a Be—Se-type structure on the boundary between the unit cell blocks. Metallic-type electrical conductivity in BISCO systems is known to be mainly due to the Cu—O layers which are situated in the center of unit cell blocks and are therefore screened from intercalated Se atoms by Bi—O and Sr layers. On the other hand, the Bi—O layers are adjacent to the Se atoms and may form a semiconducting layered structure exhibiting high S.

Figure 4:
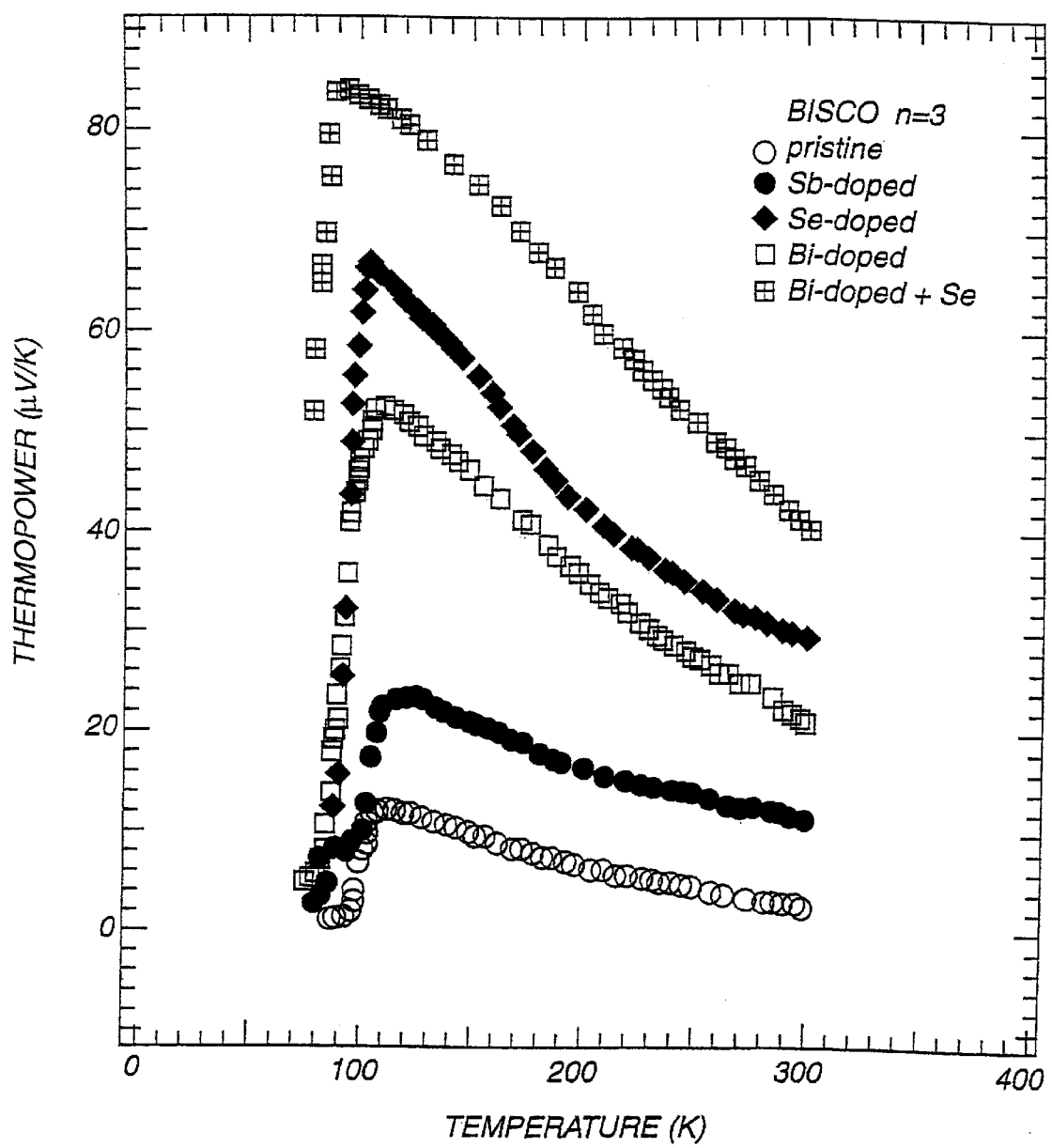
FIG. 4 is a plot graphically demonstrating the relatively high positive (p-type) Seebeck coefficient values characteristic of various thermoelectric materials of the present invention at temperatures between approximately 100–300° K.

We have also observed strong enhancement of S while retaining high σ in the BISCO n=3 system using Se, Te, Bi, Sb and their combinations as intercalants (see FIG. 4). This effect was especially dramatic when the BISCO sample was initially intercalated with Bi and then subsequently with Se (see FIG. 4). The degree of S enhancement was observed to be defined by the intercalation level and the particular combination of intercalant species leaving us with a vast room for optimization of Z. The thermoelectric materials of the present invention are characterized by Z~0.002 $K^{-1}$ at 100° K. This compares favorably with thermoelectric materials known in the prior art. A distinct feature of the thermoelectric materials of the present invention is that the high values of Z are achieved at very low temperatures around 100° K, indicating a potential to extend the thermoelectric cooling range well below the current frontier of ~200° K.

It is important to note that we were able to produce samples with both large positive (p-type, FIG. 4) and large negative (n-type thermoelectric, see FIG. 5) S values. For practical device applications, it is instrumental to have both p- and n-type since thermoelectric coolers require a series connection of p- and n-type elements. We have found that, in order to obtain n-type thermoelectric materials, the BISCO hosts can be intercalated with commercially available organometallic compounds, metal phthalocyanines (MPc, where M=Fe, Ni, Cu, etc., and Pc=$FeC_{32}N_{16}H_8$). Intercalation of MPc molecules brings about charge transfer from MPc to the host thereby changing the sign of charge carriers from positive to negative. The values of S were found to be strongly dependent on metal (M) in MPc, concentration of the intercalated MPc molecules, and on BISCO host. So far, the highest values of S were found in the BISCO n=3 samples intercalated with FePc (see FIG. 5).

Intercalation is accomplished by exposing the host metallic solid (e.g., BISCO) to an intercalant (e.g., Se) vapor in a vacuum of ~$10^{-3}$ Torr inside a sealed quartz tube for 0.5 to 50 hours. The reaction temperature $T_r$ is chosen to be high enough to provide reasonably high intercalant vapor pressure (~0.01 Torr or higher). However, using $T_r > 600$° C. can lead to an oxygen loss by BISCO host and decreased σ. The $T_r$ was about 300° C. for Se, 400° C. (Te), 480° C. (FePc), 520° C. (Sb), and 580° C. (Bi). Finally, the sample is annealed at a temperature 10–20° C. below the $T_r$ for 0.5 to 10 hours to remove possible deposit of non-reacted intercalant.

Thus, in accordance with another aspect of the present invention, a method of producing a thermoelectric material is provided. The method includes a step of intercalating a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a metallic layered host selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

More specifically defining the method, the intercalating step includes sealing the first reagent and a metallic layered host into an evacuated vessel and heating the vessel to promote intercalation of the first reagent into the metallic layered host as a semiconducting layer. Still more preferably, the sealing step includes positioning the first reagent and the metallic layered host at opposite ends of the vessel. Further, the intercalating step may be defined as including the step of annealing to evaporate away any surface deposit of non-intercalated first reagent.

In addition, for certain applications it may be desirable to intercalate a second reagent. Accordingly, the method may also include the step of intercalating a second semiconducting layer forming reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a thermoelectric material consisting of said first semiconducting layer intercalated into said metallic layered host.

The following examples are to further illustrate the invention but it is not to be considered as limited thereto.

EXAMPLE 1

Intercalation of $Bi_2Sr_2Ca_1Cu_2O_8$ (BISCO n=2) pellet with FePc

Figure 5:
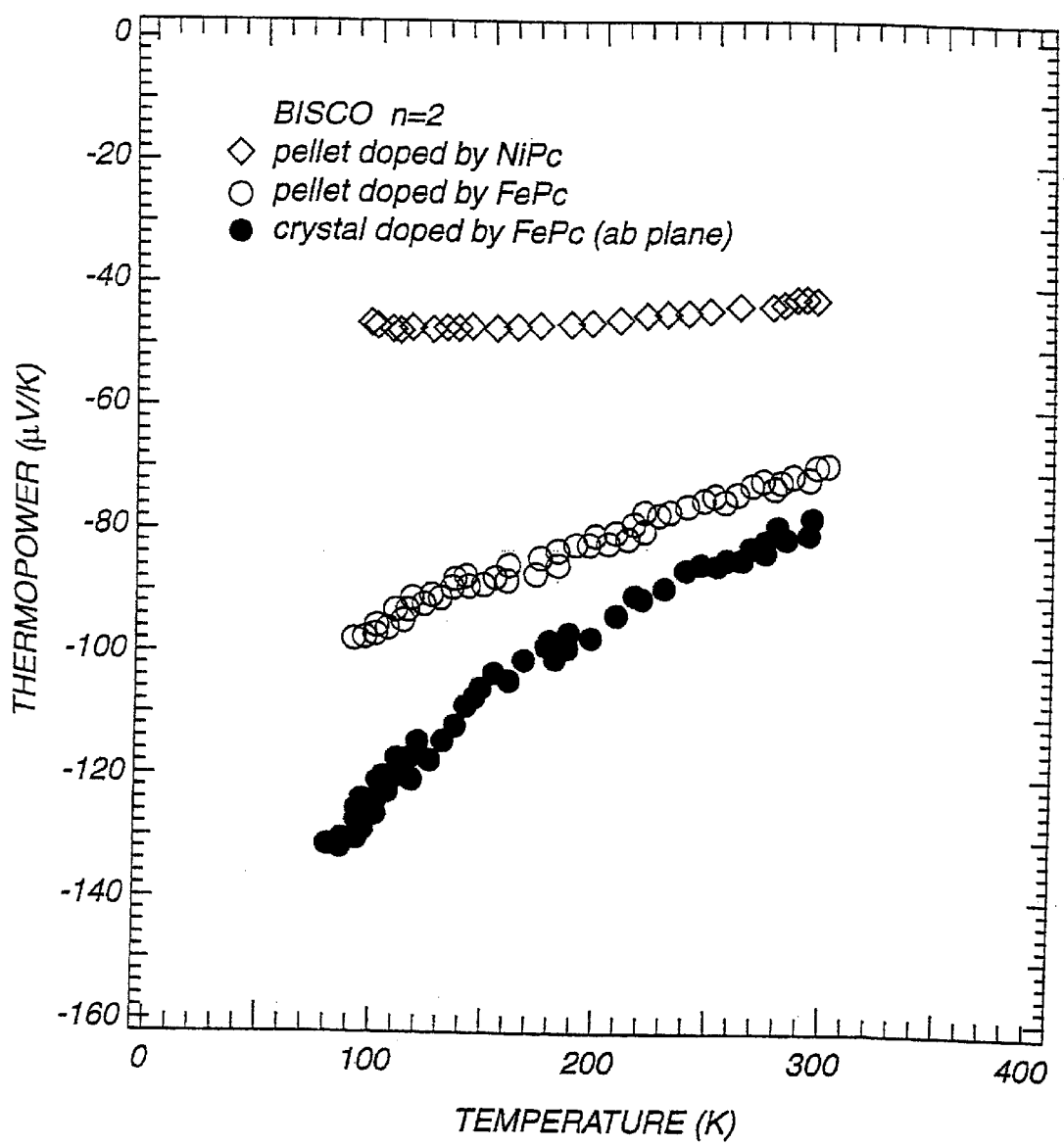
FIG. 5 is a plot graphically illustrating the relatively large negative (n-type) Seebeck coefficient values characteristic of various thermoelectric materials of the present invention at temperatures between approximately 100–300° K.

A rectangular 23 mg pellet of $Bi_2Sr_2Ca_1Cu_2O_8$ was sealed in an evacuated (0.001 Torr) quartz tube together with 10 mg (large excess) of FePc powder. The reagents were placed at opposite ends of the tube. The tube was introduced into a preheated furnace so that the temperatures of the BISCO pellet and the FePc powder were 480° C. and 450° C., respectively. The reagents were kept at these temperatures for 20 hours, then the temperature of the BISCO pellet was decreased to 450° C., and that of the FePc powder to 200° C. The purpose of this second step (annealing) was to evaporate away any possible surface deposit of non-intercalated, excess FePc. The annealing was carried out for 10 hours, then the furnace was cooled down to 20° C. The intercalated pellet exhibits large negative thermopower (FIG. 5)

EXAMPLE 2

Intercalation of $Bi_2Sr_2Ca_2Cu_3O_{10}$ (BISCO n=3) pellet with Se

Figure 3:
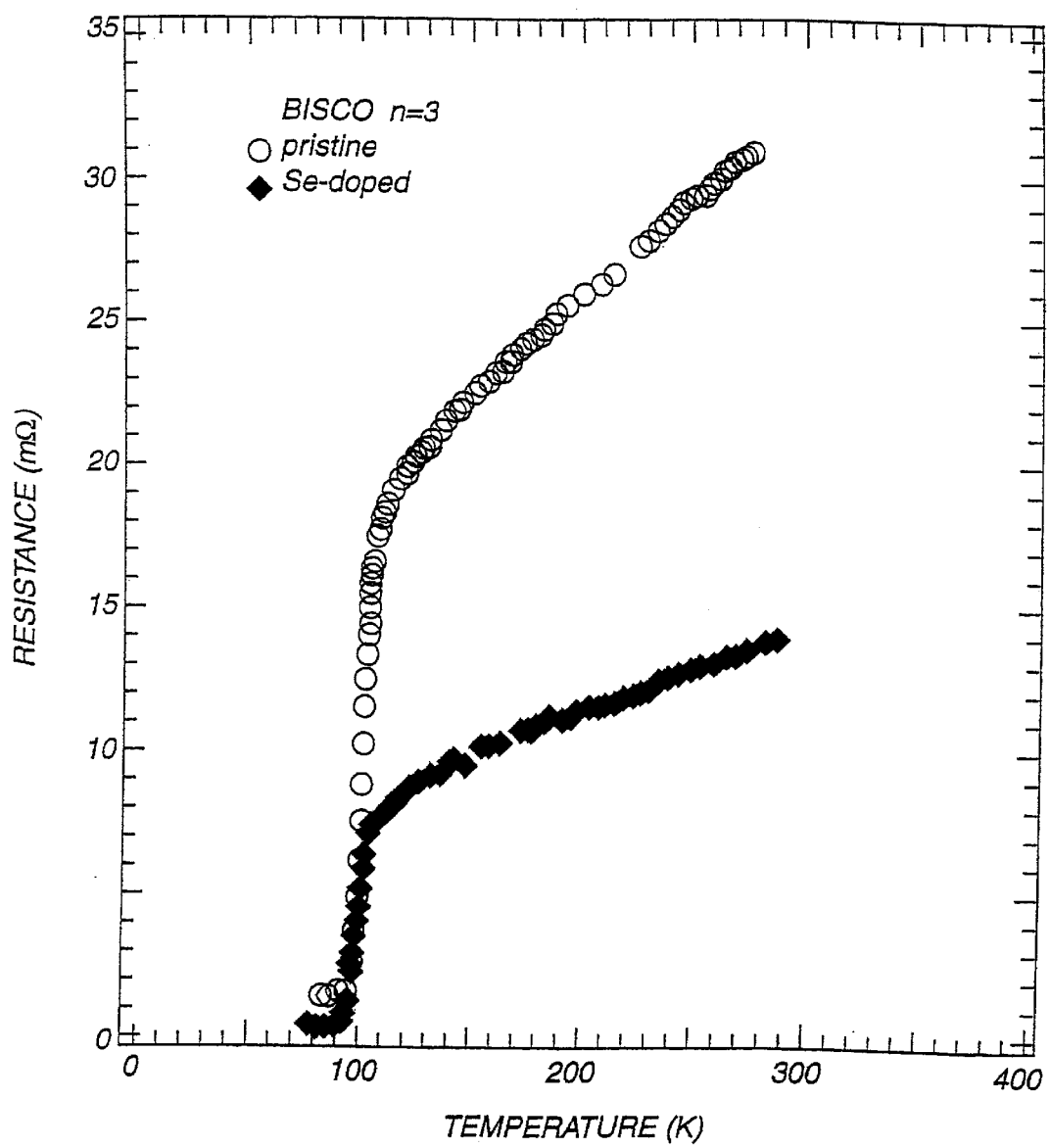
FIG. 3 is a plot demonstrating the relatively high electrical conductivity characteristic of the thermoelectric materials of the present invention.

A rectangular 13 mg pellet of $Bi_2Sr_2Ca_2Cu_3O_{10}$ was sealed in an evacuated (0.001 Torr) quartz tube together with 4 mg of Se powder. The reagents were placed at opposite ends of the tube. The tube was introduced into a pre-heated furnace so that the temperatures of the BISCO pellet and the Se powder were 300° C. and 280° C., respectively. The reagents were kept at these temperatures for 2 hours, then the temperature of the BISCO pellet was decreased to 280° C., and that of the Se powder to 20° C. The intercalated BISCO pellet was annealed at 280° C. for 10 hours. This Se-intercalated BISCO n=3 pellet exhibits increased electrical conductivity (FIG. 3) and thermopower (FIG. 4, filled diamonds) as compared to the pristine BISCO n=3 (FIGS. 3 and 4, open circles).

EXAMPLE 3

Two-step Intercalation of $Bi_2Sr_2Ca_2Cu_3O_{10}$ (BISCO n=3) with Bi—Se

First Step

A rectangular 17 mg pellet of $Bi_2Sr_2Ca_2Cu_3O_{10}$ was sealed in an evacuated (0.001 Torr) quartz tube together with 14 mg of Bi powder. The reagents were placed at opposite ends of the tube. The tube was introduced into a pre-heated furnace so that the temperatures of the BISCO pellet and the Bi powder are 580° C. and 550° C., respectively. The reagents were kept at these temperatures for 0.5 hour, then the temperature of the BISCO pellet was decreased to 550° C., and that of the Bi powder to 380° C., and the intercalated BISCO pellet was annealed for 1 hour. Then, the tube was cooled to 20° C. and opened, and the intercalated BISCO pellet was removed. Thermopower of this Bi-intercalated BISCO n=3 pellet (FIG. 4, open squares) was notably increased over that of the pristine BISCO n=3 (FIG. 4, open circles).

Second Step

The Bi-intercalated BISCO n=3 pellet obtained in the first step, was again sealed in an evacuated (0.001 Torr) quartz tube together with 6 mg of Se powder. The reagents were placed at opposite ends of the tube. The tube was introduced into a preheated furnace so that the temperatures of the Bi-intercalated BISCO pellet and the Se powder were 310° C. and 300° C., respectively. The reagents were kept at these temperatures for 1 hour, then the temperature of the BISCO pellet was decreased to 280° C., and that of the Se powder to 80° C., and the BISCO pellet was annealed for 2 hours. Thermopower of this Bi—Se-intercalated BISCO n=3 pellet (FIG. 4, cross-filed squares) is further enhanced as compared to the values obtained in the first step (FIG. 4, open squares).

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

We claim:

1. A thermoelectric material comprising: a unit cell including a semiconducting layer formed from a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po, and any mixtures and alloys thereof intercalated into a metallic layered host selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

2. The thermoelectric material of claim 1, wherein said metallic layered host is selected from the group consisting of $Bi_2Sr_2Ca_{n-1}Cu_nO_{4+2n}$ or $Tl_2Ba_2Ca_{n-1}Cu_nO_{4+2n}$ where n=1, 2, 3 or 4, $Nd_{2-y}Ce_yCuO_4$ and $La_{2-y}Sr_yCuO_4$ where y=0, 1 or 2 and $Pb_2Sr_2Y_{1-y}Ca_yCu_3O_8$, $HgBa_2Y_{1-y}Ca_yCu_nO_{2n+2}$ where y=0 or 1 and any mixtures thereof.

3. The thermoelectric material of claim 1 wherein said semiconducting layer is formed from $FeC_{32}N_{16}H_8$ and said metallic layered host is $Bi_2Sr_2CaCu_2O_8$.

4. The thermoelectric material of claim 1, wherein said semiconducting layer is formed from Se and said metallic layered host is $Bi_2Sr_2Ca_2Cu_3O_{10}$.

5. The thermoelectric material of claim 1, wherein said semiconducting layer is formed from Bi—Se and said metallic layered host is $Bi_2Sr_2Ca_2Cu_3O_{10}$.

6. A thermoelectric material, comprising: a unit cell including semiconducting and metallic layers characterized by a Seebeck coefficient S of 80–140 $\mu V/K°$ and an electrical conductivity σ of $10^3$–$10^4$ (Ωcm).

7. A thermoelectric material, comprising: a unit cell including semiconducting and metallic layers characterized by an electric figure of merit Z of about $2×10^{-3} K^{-1}$ at 100° K.

8. A method of producing a thermoelectric material, comprising:

intercalating a first reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a metallic layered host selected from the group consisting of Bi—Sr—Ca—Cu—O system and derivatives, La—Sr—Cu—O system and derivatives, Tl—Ba—Ca—Cu—O system and derivatives, Nd—Ce—Cu—O system and derivatives, Pb—Sr—Y—Ca—Cu—O system and derivatives, Hg—Ba—Ca—Cu—O system and derivatives and any mixtures thereof.

9. The method of claim 7 wherein said intercalating step includes:

sealing said first reagent and said metallic layered host into an evacuated vessel; and heating said vessel to promote intercalation of said first reagent into said metallic layered host.

10. The method of claim 9, wherein said sealing step includes positioning said first reagent and said metallic layered host at opposite ends of said vessel.

11. The method of claim 9, wherein said intercalating step further includes annealing to evaporate away any possible surface deposit of non-intercalated first reagent.

12. The method of claim 11, including intercalating a second reagent selected from the group consisting of (a) MPc where M=Sc, Y, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg and Pc=$C_{32}N_{16}H_8$, (b) $MHal_x$ where M is a metal, Hal is a halogen and x=2 or 3 and (c) C, Si, Ge, Sn, Pb, P, As, Sb, Bi, S, Se, Te, Po and any mixtures and alloys thereof into a thermoelectric material consisting of said first reagent intercalated into said metallic layered host.

* * * * *

UNITED STATES PATENT AND TRADEMARK OFFICE
CERTIFICATE OF CORRECTION

PATENT NO. : 6,091,014
DATED : July 18, 2000
INVENTOR(S) : Peter C. Eklund; Leonid Grigorian; Keith A. Williams; Gamini U. Sumanasekera It is certified that error appears in the above-identified patent and that said Letters Patent is hereby corrected as shown below:

Column 8, claim 9,
Line 66 (actual line 69), replace the number "7" with the number -- 8 --.

Signed and Sealed this

Eleventh Day of December, 2001

Attest:

NICHOLAS P. GODICI
Attesting Officer   Acting Director of the United States Patent and Trademark Office